United States Patent [19]
Chevion et al.

[11] Patent Number: 5,142,283
[45] Date of Patent: Aug. 25, 1992

[54] ARITHMETIC COMPRESSION CODING USING INTERPOLATION FOR AMBIGUOUS SYMBOLS

[75] Inventors: Dan S. Chevion, Haifa; Ehud D. Karnin; Eugeniusz Walach, both of Kiryat Motzkin, all of Israel

[73] Assignee: International Business Machines Corporation, Armonk, N.Y.

[21] Appl. No.: 555,560

[22] Filed: Jul. 19, 1990

[30] Foreign Application Priority Data

Jul. 31, 1989 [IL] Israel .................................. 091158

[51] Int. Cl.$^5$ .............................................. H03M 7/26
[52] U.S. Cl. .................................... 341/107; 341/106; 341/109
[58] Field of Search .................. 341/106, 107, 95, 51, 341/109

[56] References Cited

U.S. PATENT DOCUMENTS

| | | | |
|---|---|---|---|
| 3,701,108 | 10/1972 | Loh et al. ........................ | 341/106 X |
| 4,494,108 | 1/1985 | Langdon, Jr. et al. .............. | 341/51 |
| 4,881,075 | 11/1989 | Weng .............................. | 341/106 X |
| 4,891,643 | 1/1990 | Mitchell et al. .................. | 341/107 |
| 5,023,611 | 6/1991 | Chamzas et al. ................... | 341/51 |

*Primary Examiner*—Sharon D. Logan
*Attorney, Agent, or Firm*—R. Bruce Brodie

[57] ABSTRACT

A method for substituting interpolated values for ambiguous symbols in an arithmetically encoded symbol string, symbols in the unencoded original string being drawn from a Markov source and a finite alphabet. Ambiguity of a symbol is defined as where its symbol occurrence statistic lies outside of a predetermined range. Interpolation involves selectively combining the occurrence statistics of symbols adjacent the ambiguous symbol and recursively and arithmetically encoding the combined statistics. The method otherwise encodes unambiguous symbols in a conventional arithmetic manner. The decoding duals are also described.

3 Claims, 9 Drawing Sheets

ARITHMETIC COMPRESSION CODING USING INTERPOLATION FOR AMBIGUOUS SYMBOLS

FIELD OF THE INVENTION

This invention relates to an improved method of arithmetic coding and to a system for carrying out the method.

BACKGROUND OF THE INVENTION

The arithmetic coder was developed by Rissanen and first published in an article entitled "Generalized Kraft Inequality Arithmetic Coding", IBM Journal of Research and Development, Volume 20, No. 3, May 1976. The Arithmetic Coding procedure introduced by Rissanen permits the compression of multi-alphabet data, i.e. data each of whose symbols may be found within a multi-symbol alphabet. By "compression" of a source data string is meant reducing the amount of data associated with the source data string, without reducing its information content. Thus, by compressing the source data string, output data may be constructed having a lower data content than the original source data, whilst still permitting the source data in its entirety to be reconstructed.

Arithmetic coding procedures normally represent the output data string as a binary fraction within the unit interval (0,1). As is explained in "An Introduction to Arithmetic Coding" by Langdon, Jr. in the IBM Journal of Research and Development, Volume 28, No. 2, March 1984, arithmetic coding is related to the process of sub-dividing the unit interval. This sub-division is achieved by marking along the unit interval code points $C_n$ for each symbol within the source alphabet, each code point being equal to the sum of the probabilities of occurrence of the preceding symbols. The width or size $A_n$ of the sub-interval to the right of each code point represents the probability of occurrence of the source data string up to the corresponding symbol (cf. FIG. 1 of that publication).

Consider, for example, a source data string whose alphabet comprises symbols $a_0$ to $a_m$, having probabilities of occurrence equal to $p(0)$ to $p(m)$, respectively. If the source data string is $a_0a_5a_3$ ... then the first symbol $a_0$ will be encoded within the sub-interval $(0,p(0))$. This represents a first subinterval within the original unit interval whose width $A_1$ is equal to $p(0)$ corresponding simply to the probability of occurrence of symbol $a_0$. In order to encode the second symbol $a_5$ of the source data string, its probability of occurrence conditional on the probability of symbol $a_0$ occurring must be determined. Furthermore, the cumulative probability $S(5)$ associated with the second symbol $a_5$ must be calculated. Thus, the sub-interval corresponding to the second symbol $a_5$ is a second sub-interval within the first sub-interval corresponding to $a_0$. Mathematically, the width $A_2$ of the second sub-interval is equal to $p(0)*p(5)$, i.e. the product of the probabilities of occurrence of both symbols $a_0$ and $a_5$. The starting point of the second sub-interval within the unit interval depends on the width $A_1$ of the first sub-interval and the cumulative probability $S(5)$ associated with the second symbol $a_5$, being equal to their product $A_1*S(5)$.

Thus, as each symbol of the source data string is successively encoded within the unit interval, a succession of sub-intervals is generated each of which may be specified in terms of a specific code point and width. The code point for the current sub-interval corresponds to the start of the current sub-interval within the previous interval or sub-interval. As explained above, this is equal to the cumulative probability associated with the current symbol. Thus, the code point associated with the nth sub-interval will be equal to the code point associated with the n1th sub-interval plus the width of the n-1th sub-interval multiplied by the cumulative probability of the current symbol, i.e. $C_n = C_{n-1} + A_nS(i)$. The width of the new sub-interval itself will be equal to the product of the probabilities of all symbols (including the current one) so far encoded, i.e. $p(0)*p(5)*p(3)$ ... for the above source data string. The data corresponding to the width $A_n$ and code points $C_n$ of the nth sub-interval thus encode the first $n+1$ symbols in the source data string. Arithmetic coders therefore require two memory registers, usually called the A and C registers, for storing these data.

Although arithmetic coders produce optimum compression, corresponding to the entropy of the source data string, when based on the exact probabilities of occurrence of the symbols constituting the data string, in fact prior implementations of arithmetic coding procedures have tended to introduce approximations on account of the difficulty in determining the exact probabilities. Such approximations reduce the efficiency of the arithmetic coding operation and result in an output data string being generated which has more symbols than the theoretical minimum, or entropy. Moreover, further approximations have been introduced in order to eliminate the multiplication operation, which is required for determining the width of each successive sub-interval.

Thus, for example, U.S. Pat. No. 4,286,256 (Langdon, Jr. et al.) discloses a method and means for arithmetic coding using a reduced number of operations. Langdon simplifies the multiplication operation by truncating one of the inner products corresponding to the width of the sub-interval prior to encoding the current code-point. However, Langdon's method is suitable only for binary sources (i.e. alphabets containing only two symbols) wherein it is possible to encode each symbol of the source data string either as a more probable or less probable event. This procedure is unsuitable for multi-alphabet codes.

U.S. Pat. No. 4,652,856 (Mohiuddin et al.) discloses a multiplication-free multi-alphabet arithmetic code in which each sub-interval is stored in floating point format, as explained above, such that the mantissa stored within the A register is a binary fraction greater than 0.1. In accordance with the approximation proposed by Mohiuddin, a variable criterion is adopted which either truncates the mantissa of the sub-interval to exactly 0.1 (binary) or, alternatively, rounds it up to 1. Such an approximation still achieves the desired compression, but at a loss of efficiency. In other words, more bits than the minimum are required for representing the compressed data string. The inefficiency associated with Mohiuddin's procedure depends on the nature of the source data being compressed.

Our co-pending Israel Patent Application No. 86993 discloses an improved method of generating a compressed representation of a source data string each symbol of which is taken from a finite set of $m+1$ symbols, $a_0$ to $a_m$. The method is based on an arithmetic coding procedure wherein the source data string is recursively generated as successive sub-intervals within a predetermined interval. The width of each sub-interval is theoretically equal to the width of the previous sub-interval multiplied by the probability of the current symbol. The improvement derives from approximating the width of the previous sub-interval so that the approximating can be achieved by a single shift and add operation using a suitable shift register.

In the above-mentioned patent application, a detailed worked example is given of the proposed method for encoding a source data string having 7 symbols taken from a 5 symbol alphabet. It was assumed, for ease of explanation, that the probabilities of occurrence for each symbol were known and invariable. In fact, the method is equally well suited to the more general situation wherein the probability of occurrence for each symbol varies for different occurrences of the same symbol along the source data string. Nevertheless, Israel Patent Application No. 86993 is not concerned with the derivation of probabilities but only with the specific implementation of an improved arithmetic coder.

In fact, it is well known that the probability of a symbol in a source data string depends on the context in which the symbol appears. By "context" is meant the pattern of symbols in the immediate vicinity of the symbol in question. Thus, the context of a particular symbol in a one-dimensional string may include one or more symbols on either or both sides of the particular symbol. Thus, for example, if the source data string represents pixel information in an image processing system, wherein each pixel can be either 0 or 1, depending on whether it is black or white in colour, respectively, then clearly in a dark section of the image all of the pixels are 0, whilst in a bright area of the image all of the pixels are 1. Thus, a particular pixel within a bright area will be surrounded on all four sides by pixels having a value of 1. If, when determining the probability of a particular pixel, we consider the context of the two preceding pixels, then it is clear that the context of a pixel in the middle of a bright section of the image will be equal to 11X (X being the particular pixel).

Rephrasing what has been stated above, it is clear that the probability of a particular symbol depends upon its context. Thus, in the example given above, if it is known that the context of a symbol is 11X, then it is much more likely that the symbol in question is 1 than if the context were 00. Furthermore, if the context of the symbol were not limited merely to two symbols but were increased to a greater number of symbols, then the probability of a particular symbol as a function of its context could be determined even more accurately. Thus, if the context comprises 10 symbols, all of which are equal to 1, then the probability that the symbol in question is equal to 0 is much more remote than if the context were only two symbols, both equal to 1.

Determining the probability of a symbol as a function of its context is well known in the art and may be employed in any of the prior art patent specification referred to above. It is also known that the information content of a symbol is given by:

$$i = -\log 2p \qquad (1)$$

where p is equal to the probability of occurrence of the symbol.

It may thus be shown that when transmitting binary data, wherein each symbol is either 0 or 1, the average number of bits appearing in the compressed data string for each symbol appearing in the source data string is equal to the expected value of i, i.e.

$$\text{Average No. of Bits} = -\{p\log 2p - (1-p)\log 2(1-p)\} \qquad (2)$$

From the above equation, it follows readily that, for a binary alphabet, when the probability of occurrence of a symbol is equal to 0.5, the average number of bits required to compress the symbol is equal to 1. In other words, compression is not possible. For an alphabet having n symbols, compression is impossible when the probability of a symbol is equal to 1/n.

Consider again the example described above the regard to the compression of image data. In the simple binary case corresponding to dark and bright areas of the image, the average number of bits required to compress each pixel whose context is either . . . 000 . . . or . . . 111 . . . will be significantly less than 1, thereby resulting in efficient compression of the source data. However, the probability of a particular pixel at the border between a dark and bright section of the image is equal to 0.5 since, based on the context including the current symbol and a predetermined number of pixels in the dark area, it would be assumed that the current pixel is 0, whilst based on a context including the current symbol and the same number of pixels in the bright area, it would be equally well expected that the current symbol is 1. Thus, when transmitting image data, a high price must be paid in terms of information in order unambiguously to transmit the data corresponding to those pixels at the border between substantially dark and substantially bright areas of the image.

SUMMARY OF THE INVENTION

It is an object of the invention to provide an arithmetic coder in which the probability of a symbol is determined according to the context of the symbol and wherein the disadvantages associated with hitherto proposed arithmetic coders are substantially reduced or eliminated.

According to a broad aspect of the invention, there is provided a method for arithmetic coding of a pattern of symbols so as to produce a compressed output code string, said symbols being taken from a finite symbol set and each symbol appearing in a position of said pattern, said code string being a number based on the probabilities of said symbols appearing in said positions, the method comprising the following steps:

determining predictable positions PP and unpredictable positions UP in the pattern, by evaluating a given first subpattern of positions in the vicinity of each position; a UP being defined when the position subpattern contains any one of a set of given symbol subpatterns, and a PP being defined in all other case;

for each symbol in a PP, applying normal arithmetic coding, using the respective symbol's probability in the respective position; and for each symbol in a UP, applying arithmetic coding, using the combined probability of a predetermined set of possible symbols which can appear in the respective position.

According to a second aspect of the invention, there is provided a method for lossless arithmetic coding of a pattern of symbols so as to produce a compressed output code string, said symbols being taken from a finite symbol set and each symbol appearing in a position of said pattern, said code string being a number based on the probabilities of said symbols appearing in said positions, the method comprising the following steps:

determining predictable positions PP and unpredictable positions UP in the pattern, by evaluating a given first sub-pattern of positions in the vicinity of each position representing the context; a UP being defined when the position subpattern contains any one of a set of selected symbol subpatterns, and a PP being defined in all other case;

for each symbol in a PP, applying normal arithmetic coding, using the respective symbol's probability in the respective context; and for each symbol in a UP, evaluating a second subpattern of positions larger than said given first subpattern so as to render said UP predictable, and performing arithmetic coding with an updated probability of each symbol derived from said second subpattern.

According to a third aspect of the invention, there is provided a system for carrying out the above method, said system comprising:

a first memory for storing said first subpattern of positions for each symbol,

A second memory for storing a predetermined set of possible subpatterns.

comparing means for comparing, for each symbol, the first subpattern in the first memory with each one of the set of subpatterns in the second memory and generating a first signal, in the event that said first subpattern matches one of the set of subpatterns, and a second signal otherwise;

a third memory for storing a first look-up table containing the probabilities of each symbol in the symbol set according to each one of the complete set of possible subpatterns, a fourth memory for storing a second look-up table containing the combined probabilities of a predetermined set of possible symbols according to said predetermined set of subpatterns, reading means coupled to the comparing means and responsive to either one of said first and second signals for reading either one of said third and fourth memories, respectively, so as to determine the stored probability corresponding to said first subpattern, and arithmetic coding means coupled to the reading means and responsive to the determined probability for encoding each symbol.

Thus, in accordance with the invention, data is split into classes corresponding to predictable and unpredictable points which are then treated separately. Predictable points are encoded using an arithmetic coder in the normal manner. When it is desired to encode an unpredictable point, there are several options available depending upon whether a lossy or a lossless encoder is implemented. In either case, the complete class of symbols containing the unpredictable symbol is transmitted by implementing a normal arithmetic coder but, instead of utilising the probability of the current symbol, utilising the combined probability of the complete class of symbols containing the unpredictable point.

For lossy coding, this itself is sufficient and a suitable decoder will be able to determine which class of symbols is represented by the unpredictable point. The unpredictable point itself is not encoded, other than indicating the general class to which it belongs and, in this manner, a smaller price is paid in terms of information content than would be paid if the symbol itself were encoded.

For lossless encoding, the context of an unpredictable point may be increased so as to render the probability of the symbol at that point different from 1/n for an n-symbol alphabet and thereby enable prediction thereof.

During decoding, the respective context of each symbol as it is successively decoded is used in order to establish whether the symbol represents a predictable or an unpredictable point, according to exactly the same rules as the encoder. For predictable points, the symbol is decoded using the normal rules of arithmetic coding, whilst for unpredictable points there are several options, depending upon whether lossy or lossless decoding is required.

For lossy decoding, the unpredictable point is merely replaced by an auxiliary symbol which indicates the complete class of which the unpredictable point is a member. In this case, the resulting decoded output string is a set of possible strings rather than a unique string.

For lossless decoding, the context of an unpredictable point may be increased, in exactly the same manner as was done for encoding, in order to obtain for the unpredictable point a probability different from 1/n and thereby enable prediction thereof. In a one-pass decoder according to the invention, the context is increased in the vicinity of the unpredictable point by increasing the number of symbols appearing before that point. In a two-pass decoder according to the invention, the context is increased by considering points appearing after the unpredictable point as well.

In the lossy decoder, instead of replacing an unpredictable point by an auxiliary symbol representative of a set of strings, the unpredictable point may be guessed by means of interpolation or extrapolation of the decoded string in the vicinity of the unpredictable point.

BRIEF DESCRIPTION OF THE DRAWINGS

The invention will now be described with regard to a method and system for arithmetic coding of a pattern of symbols, by means of non-limiting example only, and with reference to the accompanying drawings, in which.

DETAILED DESCRIPTION OF PREFERRED EMBODIMENTS

Figure 1:
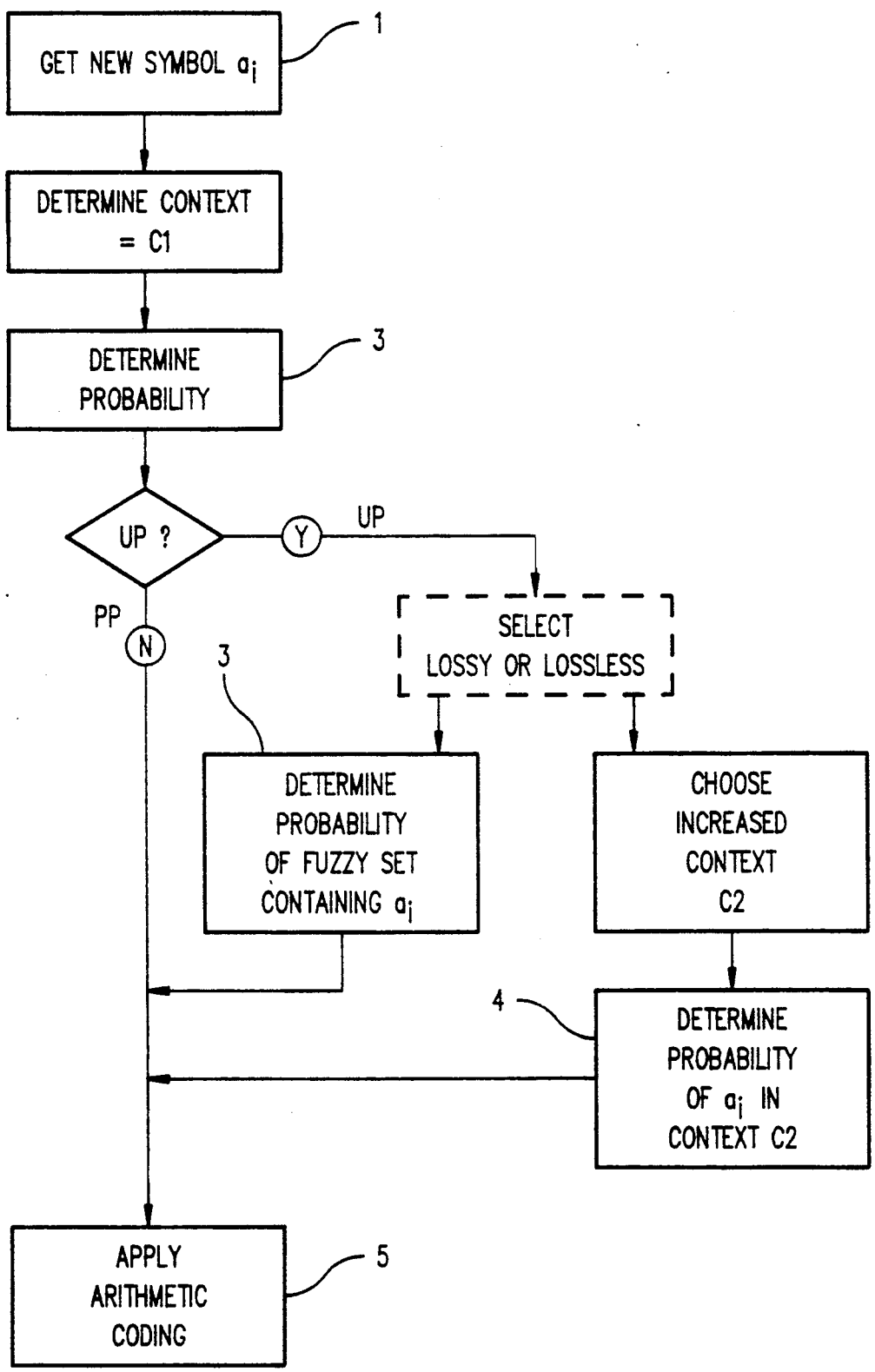
FIG. 1 is a flow diagram showing the principal steps in a generalized method of lossless or fuzzy arithmetic coding according to the invention.

Referring to FIG. 1, there is shown a flow diagram of a generalized encoding procedure according to the invention. The main steps of the procedure are numbered 1, 3, 4 and 5, for reasons which will become apparent below with reference to FIG. 7 of the drawings.

For each symbol in the source data string the context is determined by evaluating a given sub-pattern of positions in the vicinity of the symbol. For a linear source data string, the context may be evaluated by considering symbols on one side only of the current symbol or, alternatively, on both sides. For two-dimensional data, such as occurs, for example, in image processing, the context may be evaluated on any or all of the four sides of the current symbol. Clearly, when evaluation of the context involves considering symbols which occur, in real time, after the current symbol, the source data string must be stored and post-processed, resulting in a short delay between data capture and data compression. In practice, the delay is so short as to be of negligible consequence.

Having evaluated the context of the current symbol, its conditional probability based on the current context is determined. This permits classification of the current symbol into an unpredictable point UP for which the probability is equal to 1/n (for an n-symbol alphabet) or a predictable point PP for all other probabilities. Predictable points PP are encoded using standard arithmetic coding techniques based on the probability of the current symbol.

As shown in FIG. 1, there are two alternative approaches for handling unpredictable points UP, depending upon whether lossy (fuzzy) or lossless encoding is required. For lossy encoding, the probability of the fuzzy set (a set of different symbols including the current symbol) corresponding to the current symbol is determined, and arithmetic coding is then performed formed using this combined probability so as effectively to transmit the whole class of points to which the current symbol belongs. In order to achieve lossless encoding, the context of the current symbol is increased so as to render its probability different from 1/n and hence render the point predictable. Arithmetic coding is then performed using the newly determined probability, based on the larger context, so as losslessly to encode the current symbol.

Figure 2:
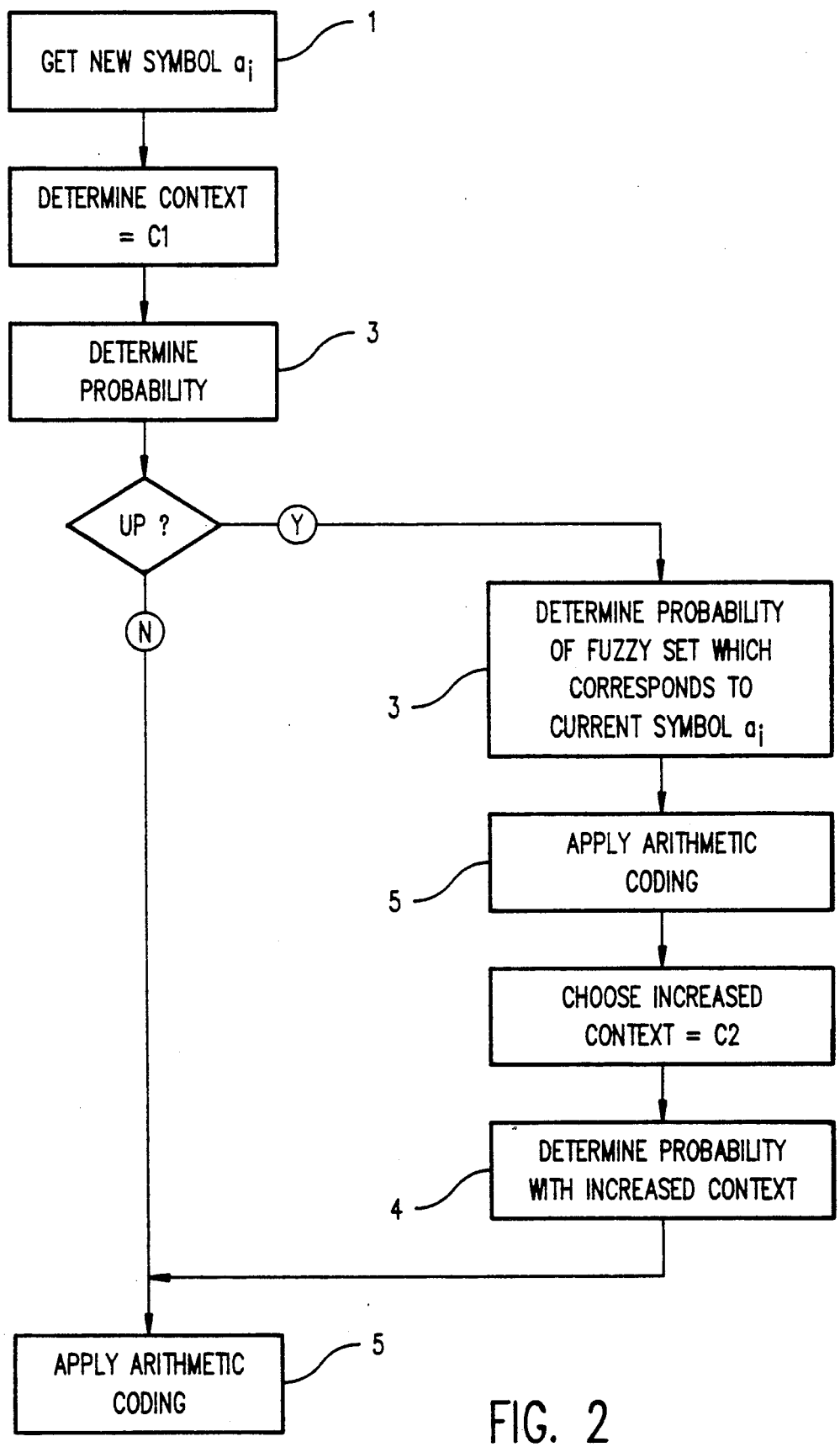
FIG. 2 is a flow diagram showing the principal steps in a method of lossless arithmetic coding according to the invention.

Referring now to FIG. 2, there is shown an alternative method for achieving lossless encoding. Predictable points are treated in exactly the same manner as described above with reference to FIG. 1. On encountering an unpredictable point UP, the probability of the fuzzy set to which the current symbol belongs is first determined and then, using this combined probability, arithmetic coding is performed so as effectively to transmit the whole class of points to which the current symbol belongs. This is identical to the procedure shown in FIG. 1. However, at this stage, the context of the current symbol is increased, in order to render it predictable, and the probability of the current symbol is then determined with the new enlarged context. The new probability will no longer be equal to 1/n (for an n-symbol alphabet) and so the current symbol is now predictable within the enlarged context and arithmetic coding may be applied in the normal manner.

From the above brief description, two significant points emerge. First, in all cases, predictable points are treated in a conventional manner using standard arithmetic coding techniques. Unpredictable points, however, which, if treated similarly, would lead to poor data compression, are processed in either two or three stages, for reason which will become clear below. In a first stage, information relating to the complete class of symbols to which the unpredictable point belongs is obtained. Optionally, arithmetic coding may now be performed (FIG. 2) in order to transmit the fuzzy set to which the current symbol belongs. In a final stage, a larger context is evaluated in order to render the unpredictable point predictable, and arithmetic coding is again performed.

Thus, in the two stage method described with reference to FIG. 1, the step of arithmetic coding is performed only once for each unpredictable point UP with an enlarged context. In the three stage method described with reference to FIG. 2, the step of arithmetic coding is performed twice, once for encoding the complete fuzzy set and one for encoding the current symbol. However, it should be understood that in this case, although an additional step of arithmetic coding is required, a knowledge of the fuzzy set to which the current symbol belongs has already been determined and is therefore known by the decoder. Consequently, the resulting probability of the current symbol, within the new enlarged context, is not the same as that for the two stage method and may result in more efficient compression of the source data string. Furthermore, the context may be enlarged by differing amounts for different fuzzy set whilst, if no knowledge of the fuzzy set is first encoded, the contest must always be increased by the same amount.

Figure 3:
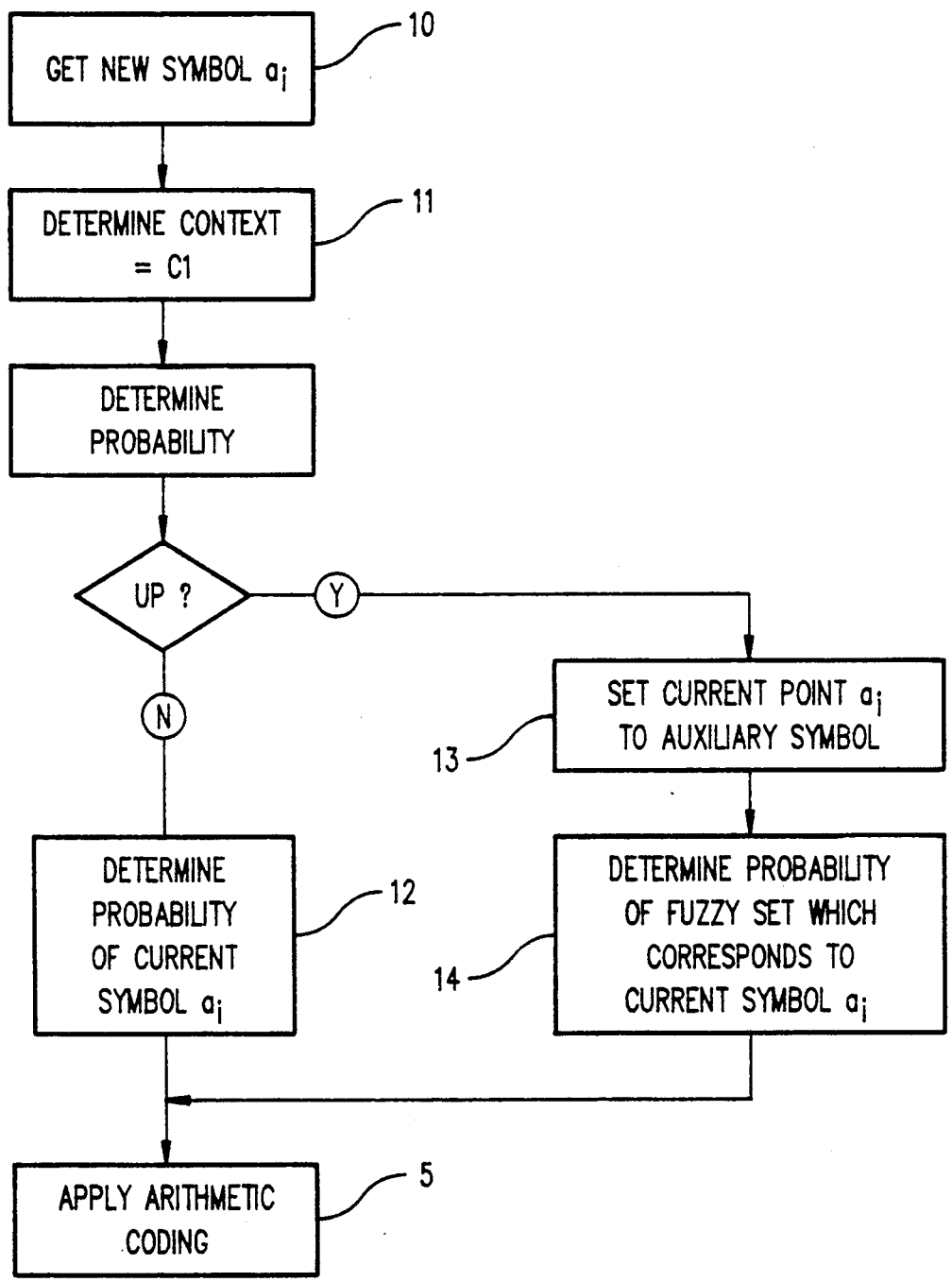
FIG. 3 is a flow diagram showing the principal steps in a method of fuzzy arithmetic coding according to the invention.
Figure 8:
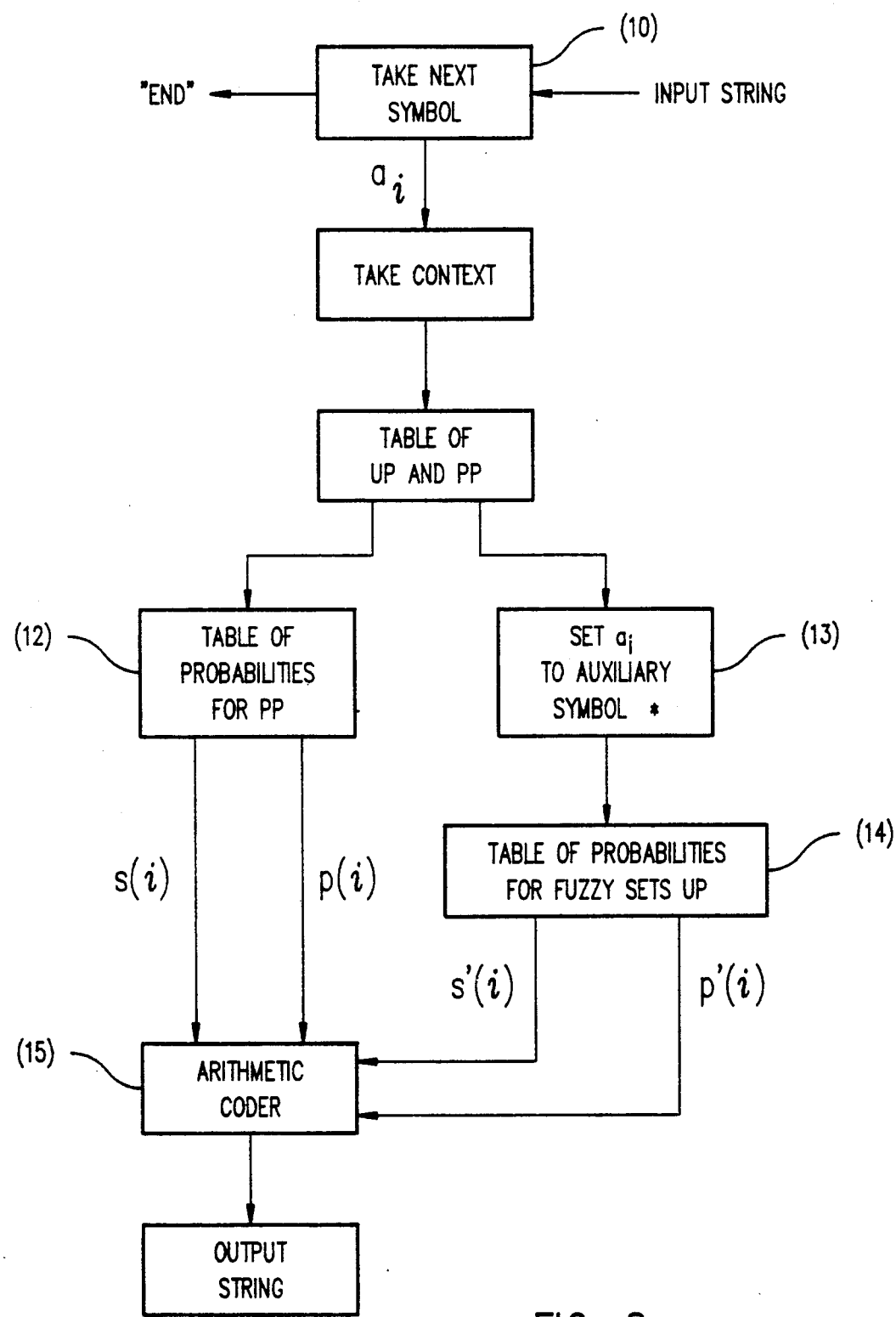
FIG. 8 relates to FIG. 3 and illustrates the flow of data between registers when performing the coding procedure according to FIG. 3.

Referring now to FIG. 3 of the drawings, the principal steps of an alternative method of lossy (fuzzy) encoding are labelled 10 to 15 for reasons which will become clear with reference to FIG. 8 of the drawings. In the method of fuzzy coding shown in FIG. 3, predictable points PP are treated in exactly the same way as explained above with reference to FIG. 1 of the drawings, using conventional arithmetic coding techniques. However, in this case, unpredictable points UP are treated differently. The current point, corresponding to a UP, is set to an auxiliary symbol and the probability of the fuzzy set to which the current symbol belongs is determined. From a knowledge of this "combined" probability, arithmetic coding is employed so as effectively to transmit information corresponding to the complete class of symbols to which the UP belongs.

From the above brief description of fuzzy coding, two points should be borne in mind. First, the auxiliary symbol is not transmitted to the decoder. The auxiliary symbol is stored in a temporary buffer within the encoder so as to permit the correct evaluation of subsequent contexts. It will be understood from what has been explained above, that the context determines the conditional probability of symbols in the source data string.

Thus, if the context of a particular symbol contains a UP, the existence and location of the UP within the current context must be known in order to determine correctly the probability of the current symbol. The auxiliary symbol is, in effect, merely a flag which indicates that the original (initial) symbol in the respective position was a UP. Secondly, the method of arithmetic coding described with reference to FIG. 3 of the drawings does not permit a unique string to be decoded at the receiver site. Instead, a set of strings is transmitted wherein unpredictable points UP are specified in terms of the complete class to which they belong. Thus, the decoded string contains somewhat less information than the original source string and, for this reason, such an encoder is termed a "fuzzy" encoder. When employed in image processing, fuzzy arithmetic coders have improved compression ratio at the expense of some deterioration in image quality. In such cases, fuzzy arithmetic coding, in accordance with the invention, would clearly be confined to those areas where such errors are unnoticeable.

In order to demonstrate the method according to the invention described above with reference to FIGS. 1 and 3 of the drawings and to show its improved performance as compared with conventional arithmetic coders, detailed examples of both methods are now given.

Consider the compression of a source data string containing symbols taken from a binary alphabet, given by:

STR = 11110000011111001001010011110000000

As was reviewed above, arithmetic coders employ two shift registers designated A and C. The A register represents the length of the code interval whilst the C register contains the actual value of the code. The contents of the A register are equal to the product of the probabilities of all symbols so far encoded, i.e.:

$A = p(a1)p(a2)p(a3)\ldots p(an-1)p(an)$ Hence.

$\log_2 A = \log_2 p(a1) + \log_2 p(a2) + \log_2 p(a3) + \ldots + \log_2 p(an-1) + \log_2 p(an)$ However, log2A represents the number of shifts required to normalize the A register which, in turn, determines the length of the code extracted from the C register. Consequently, the length of the code derived from the arithmetic coder may be calculated simply by adding the logarithms to base 2 of the probability of each encoded symbol in the source data string.

In the worked examples which follow, the actual values of the A and C registers are not considered since all that is of interest in comparing the two methods is the number of bits in the compressed code and not the actual value of the code itself.

EXAMPLE 1: Conventional Arithmetic Coder

Assume that the probability of finding a 0 or a 1 in the source string STR depends on the contexts as follows:

```
CONTEXT = 11X:   p(1) = 0.7      p(0) = 0.3
   No. of Bits required to code 1 = -log 20.7 = 0.51
   No. of Bits required to code 0 = -log 20.3 = 1.74
CONTEXT = 00X:   p(1) = 0.33     p(0) = 0.67
   No. of Bits required to code 1 = -log 20.33 = 1.60
   No. of Bits required to code 0 = -log 20.67 = 0.58
CONTEXT = 01X:   p(1) = 0.5      p(0) = 0.5
   No. of Bits required to code 1 = -log 20.5 = 1.00
   No. of Bits required to code 0 = -log 20.5 = 1.00
CONTEXT = 10X:   p(1) = 0.17     p(0) = 0.83
   No. of Bits required to code 1 = -log 20.17 = 2.56
   No. of Bits required to code 0 = -log 20.83 = 0.27
   STR = 11110000011111001001010011110000000
Step 0: Initialisation:
```

-continued

```
C = 0.bbb Step 1:       CONTEXT = 11X      STR(1) = 1
   No. of bits required to code 1 = 0.51
C = 0.bbb         Rem. = 0.51 bits Step 2:
CONTEXT = 11X           STR(2) = 1
   No. of bits required to code 1 = 0.51
C = 0.bbbb        Rem. = 0.02 bits Step 3:
CONTEXT = 11X           STR(3) = 1
   No. of bits required to code 1 = 0.51
C = 0.bbbb        Rem. = 0.53 bits Step 4:
CONTEXT = 11X           STR(4) = 1
   No. of bits required to code 1 = 0.51
C = 0.bbbbb       Rem. = 0.04 bits Step 5:
CONTEXT = 11X           STR(5) = 0
   No. of bits required to code 0 = 1.74
C = 0.bbbbbb      Rem. = 0.78 bits Step 6:
CONTEXT = 10X           STR(6) = 0
   No. of bits required to code 0 = 0.27
C = 0.bbbbbb      Rem. = 0.05 bits Step 7:
CONTEXT = 00X           STR(7) = 0
   No. of bits required to code 0 = 0.58
C = 0.bbbbbb      Rem. = 0.63 bits Step 8:
CONTEXT = 00X           STR(8) = 0
   No. of bits required to code 0 = 0.58
C = 0.bbbbbbbb    Rem. = 0.21 bits Step 9:
CONTEXT = 00X           STR(9) = 0
   No. of bits required to code 0 = 0.58
C = 0.bbbbbbbb    Rem. = 0.79 bits Step 10:
CONTEXT = 00X           STR(10) = 1
   No. of bits required to code 1 = 1.60
C = 0.bbbbbbbbb   Rem. = 0.39 bits Step 11:
CONTEXT = 01X           STR(11) = 1
   No. of bits required to code 1 = 1.00
C = 0.bbbbbbbbbb  Rem. = 0.39 bits Step 12:
CONTEXT = 11X           STR(12) = 1
   No. of bits required to code 1 = 0.51
C = 0.bbbbbbbbbb  Rem. = 0.90 bits Step 13:
CONTEXT = 11X           STR(13) = 1
   No. of bits required to code 1 = 0.51
C = 0.bbbbbbbbbb  Rem. = 0.41 bits Step 14:   CONTEXT = 11X      STR(14) = 1
   No. of bits required to code 1 = 0.51
C = 0.bbbbbbbbbb  Rem. = 0.92 bits Step 15:   CONTEXT = 11X      STR(15) = 0
   No. of bits required to code 0 = 1.74
C = 0.bbbbbbbbbbb Rem. = 0.66 bits Step 16:   CONTEXT = 10X      STR(16) = 0
   No. of bits required to code 0 = 0.27
C = 0.bbbbbbbbbbb Rem. = 0.93 bits Step 17:   CONTEXT = 00X      STR(17) = 1
   No. of bits required to code 1 = 1.60
C = 0.bbbbbbbbbbbbb Rem. = 0.53 bits Step 18:
CONTEXT = 01X           STR(18) = 0
   No. of bits required to code 0 = 1.00
C = 0.bbbbbbbbbbbbbb Rem. = 0.53 bits Step 19:
CONTEXT = 10X           STR(19) = 0
   No. of bits required to code 0 = 0.27
C = 0.bbbbbbbbbbbbbb Rem. = 0.80 bits Step 20:
CONTEXT = 00X           STR(20) = 1
   No. of bits required to code 1 = 1.60
C = 0.bbbbbbbbbbbbbbb Rem. = 0.40 bits Step 21:   CONTEXT = 01X      STR(21) = 0
   No. of bits required to code 0 = 1.00
C = 0.bbbbbbbbbbbbbbbb Rem. = 0.40 bits Step 22:   CONTEXT = 10X      STR(22) = 1
   No. of bits required to code 1 = 2.56
C = 0.bbbbbbbbbbbbbbbbbb Rem. = 0.96 bits Step 23:   CONTEXT = 01X      STR(23) = 0
   No. of bits required to code 0 = 1.00
C = 0.bbbbbbbbbbbbbbbbbb    Rem. = 0.96 bits Step 24:   CONTEXT = 10X      STR(24) = 0
   No. of bits required to code 0 = 0.27
C = 0.bbbbbbbbbbbbbbbbbbb   Rem. = 0.23 bits Step 25:   CONTEXT = 00X      STR(25) = 1
   No. of bits required to code 1 = 1.60
C = 0.bbbbbbbbbbbbbbbbbbbb  Rem. = 0.83 bits Step 26:   CONTEXT = 01X      STR(26) = 1
   No. of bits required to code 1 = 1.00
C = 0.bbbbbbbbbbbbbbbbbbbbb Rem. = 0.83 bits Step 27:   CONTEXT = 11X      STR(27) = 1
   No. of bits required to code 1 = 0.51
C = 0.bbbbbbbbbbbbbbbbbbbbbb Rem. = 0.34 bits Step 28:   CONTEXT = 11X      STR(28) = 1
```

```
No. of bits required to code 1 = 0.51
C = 0.bbbbbbbbbbbbbbbbbbbbbbbbb        Rem. = 0.85 bits Step
29:  CONTEXT = 11X     STR(29) = 0
No. of bits required to code 0 = 1.74
C = 0.bbbbbbbbbbbbbbbbbbbbbbbbbb       Rem. = 0.59 bits
Step 30: CONTEXT = 10X    STR(30) = 0
No. of bits required to code 0 = 0.27
C = 0.bbbbbbbbbbbbbbbbbbbbbbbbbbb      Rem. = 0.86 bits
Step 31:  CONTEXT = 00X    STR(31) = 0
No. of bits required to code 0 = 0.58
C = 0.bbbbbbbbbbbbbbbbbbbbbbbbbbbb     Rem. = 0.44 bits
Step 32:  CONTEXT = 00X    STR(32) = 0
No. of bits required to code 0 = 0.58
C = 0.bbbbbbbbbbbbbbbbbbbbbbbbbbbbb    Rem. = 0.02 bits
Step 33:  CONTEXT = 00X    STR(33) = 0
No. of bits required to code 0 = 0.58
C = 0.bbbbbbbbbbbbbbbbbbbbbbbbbbbbbb   Rem. = 0.60 bits
Step 34:  CONTEXT = 00X    STR(34) = 0
No. of bits required to code 0 = 0.58
C = 0.bbbbbbbbbbbbbbbbbbbbbbbbbbbbbbb  Rem. = 0.18 bits
Step 35:  CONTEXT = 00X    STR(35) = 0
No. of bits required to code 0 = 0.58
C = 0.bbbbbbbbbbbbbbbbbbbbbbbbbbbbbbbb
```

Thus, the length of the compressed code is 32 bits. Decoding the above code string produces the original source data string, STR.

EXAMPLE 2: Fuzzy Logic Arithmetic Coder (FLAC)

Assume that the probability of findings a 0 or a 1 in the source string STR depends on the contexts as follows:

```
CONTEXT = 11X:    p(1) = 0.7    p(0) = 0.3
  No. of Bits required to code 1 = − log 20.7 = 0.51
  No. of Bits required to code 0 = − log 20.3 = 1.74
CONTEXT = 00X:    p(1) = 0.33    p(0) = 0.67
  No. of Bits required to code 1 = − log 20.33 = 1.60
  No. of Bits required to code 0 = − log 20.67 = 0.58
CONTEXT = 10X:    p(1) = 0.17    p(0) = 0.83
  No. of Bits required to code 1 = − log 20.17 = 2.56
  No. of Bits required to code 0 = − log 20.83 = 0.27
CONTEXT = 01X:    "DON'T CARE"
  No. of Bits required to code * = (1.0) = 0 CONTEXT =
1*X:   p(1) = 0.75    p(0) = 0.25
  No. of Bits required to code 1 = − log 20.75 = 0.42
  No. of Bits required to code 0 = − log 20.25 = 2.00
CONTEXT = *1X:    p(1) = 0.67    p(0) = 0.33
  No. of Bits required to code 1 = − log 20.67 = 0.58
  No. of Bits required to code 0 = − log 20.33 = 1.60
CONTEXT = *0X:    p(1) = 0.85    p(0) = 0.15
  No. of Bits required to code 1 = − log 20.85 = 0.23
  No. of Bits required to code 0 = − log 20.15 = 2.74
STR = 11110000011111100100101001111100000000
Step 0:   Initialisation:
  C = 0.bbb Step 1:   CONTEXT = 11X     STR(1) = 1
  No. of bits required to code 1 = 0.51
  C = 0.bbb    Rem. = 0.51 bits Step 2:
CONTEXT = 11X:    STR(2) = 1
  No. of bits required to code 1 = 0.51
  C = 0.bbbb   Rem. = 0.02 bits Step 3:
CONTEXT = 11X     STR(3) = 1
  No. of bits required to code 1 = 0.51
  C = 0.bbbb   Rem. = 0.53 bits Step 4:
CONTEXT = 11X:    STR(4) = 1
  No. of bits required to code 1 = 0.51
  C = 0.bbbbb  Rem. = 0.04 bits Step 5:
CONTEXT = 11X     STR(5) = 0
  No. of bits required to code 0 = 1.74
  C = 0.bbbbbb Rem. = 0.78 bits Step 6:
CONTEXT = 10X     STR(6) = 0
  No. of bits required to code 0 = 0.27
  C = 0.bbbbbbb Rem. = 0.05 bits Step 7:
CONTEXT = 00X     STR(7) = 0
  No. of bits required to code 0 = 0.58
  C = 0.bbbbbbb Rem. = 0.63 bits Step 8:
CONTEXT = 00X     STR(8) = 0
  No. of bits required to code 0 = 0.58
  C = 0.bbbbbbbb    Rem. = 0.21 bits Step 9:
CONTEXT = 00X     STR(9) = 0
  No. of bits required to code 0 = 0.58
  C = 0.bbbbbbbb    Rem. = 0.79 bits Step 10:
CONTEXT = 00X     STR(10) = 1
  No. of bits required to code 1 = 1.60
  C = 0.bbbbbbbbbb  Rem. = 0.39 bits Step 11:
CONTEXT = 01X     STR(11) = *
  No. of bits required to code * = 0.00
  C = 0.bbbbbbbbbb  Rem. = 0.39 bits Step 12:
CONTEXT = 1*X     STR(12) = 1
  No. of bits required to code 1 = 0.42
  C = 0.bbbbbbbbbb  Rem. = 0.81 bits Step 13:
CONTEXT = *1X     STR(13) = 1
  No. of bits required to code 1 = 0.58
  C = 0.bbbbbbbbbbb Rem. = 0.49 bits Step 14:
CONTEXT = 11X     STR(14) = 1
  No. of bits required to code 1 = 0.51
  C = 0.bbbbbbbbbbbb    Rem. = 0.00 bits Step
15:  CONTEXT = 11X     STR(15) = 0
  No. of bits requied to code 0 = 1.74
  C = 0.bbbbbbbbbbbbb   Rem. = 0.74 bits Step
16:  CONTEXT = 10X     STR(16) = 0
  No. of bits required to code 0 = 0.27
  C = 0.bbbbbbbbbbbbb   Rem. = 0.01 bits Step
17:  CONTEXT = 00X     STR(17) = 1
  No. of bits required to code 1 = 1.60
  C = 0.bbbbbbbbbbbbbbb Rem. = 0.61 bits Step 18:
CONTEXT = 01X     STR(18) = *
  No. of bits required to code * = 0.00
  C = 0.bbbbbbbbbbbbbbb Rem. = 0.61 bits Step 19:
CONTEXT = 1*X     STR(19) = 0
  No. of bits required to code 0 = 2.00
  C = 0.bbbbbbbbbbbbbbbbb   Rem. = 0.61 bits Step
20:  CONTEXT = *0X     STR(20) = 1
  No. of bits required to code 1 = 0.23
  C = 0.bbbbbbbbbbbbbbbbb   Rem. = 0.84 bits Step
21:  CONTEXT = 01X     STR(21) = *
  No. of bits required to code * = 0.00
  C = 0.bbbbbbbbbbbbbbbbb   Rem. = 0.84 bits Step
22:  CONTEXT = 1*X     STR(22) = 1
  No. of bits required to code 1 = 0.42
  C = 0.bbbbbbbbbbbbbbbbbb  Rem. = 0.26 bits Step
23:  CONTEXT = *1X     STR(23) = 0
  No. of bits required to code 0 = 1.60
  C = 0.bbbbbbbbbbbbbbbbbbb Rem. = 0.86 bits Step
24:  CONTEXT = 10X     STR(24) = 0
  No. of bits required to code 0 = 0.27
  C = 0.bbbbbbbbbbbbbbbbbbbb    Rem. = 0.13 bits Step
25:  CONTEXT = 00X     STR(25) = 1
  No. of bits required to code 1 = 1.60
  C = 0.bbbbbbbbbbbbbbbbbbbbb   Rem. = 0.73 bits Step
26:  CONTEXT = 01X     STR(26) = *
  No. of bits required to code * = 0.00
  C = 0.bbbbbbbbbbbbbbbbbbbbb   Rem. = 0.73 bits Step
27:  CONTEXT = 1*X     STR(27) = 1
  No. of bits required to code 1 = 0.42
  C = 0.bbbbbbbbbbbbbbbbbbbbbb  Rem. = 0.15 bits
Step 28:    CONTEXT = *1X     STR(28) = 1
  No. of bits required to code 1 = 0.58
  C = 0.bbbbbbbbbbbbbbbbbbbbbb  Rem. = 0.73 bits
Step 29:  CONTEXT = 11X     STR(29) = 0
  No. of bits required to code 0 = 1.74
  C = 0.bbbbbbbbbbbbbbbbbbbbbbbb    Rem. = 0.47 bits Step
30:  CONTEXT = 10X     STR(30) = 0
  No. of bits required to code 0 = 0.27
  C = 0.bbbbbbbbbbbbbbbbbbbbbbbbb   Rem. = 0.74 bits Step
31:  CONTEXT = 00X     STR(31) = 0
  No. of bits required to code 0 = 0.58
  C = 0.bbbbbbbbbbbbbbbbbbbbbbbbbb  Rem. = 0.32 bits Step
32:  CONTEXT = 00X     STR(32) = 0
  No. of bits required to code 0 = 0.58
  C = 0.bbbbbbbbbbbbbbbbbbbbbbbbbbb Rem. = 0.90 bits Step
33:  CONTEXT = 00X     STR(33) = 0
  No. of bits required to code 0 = 0.58
  C = 0.bbbbbbbbbbbbbbbbbbbbbbbbbbbb    Rem. = 0.48 bits Step
34:  CONTEXT = 00X     STR(34) = 0
  No. of bits required to code 0 = 0.58
  C = 0.bbbbbbbbbbbbbbbbbbbbbbbbbbbbb   Rem. = 0.06 bits
Step 35:  CONTEXT = 00X     STR(35) = 0
  No. of bits required to code 0 = 0.58
```

-continued

```
C = 0.bbbbbbbbbbbbbbbbbbbbbbbbbbbbb
```

Thus, the length of the compressed code is only 29 bits. Decoding the above code string is achieved in a similar manner as for the conventional arithmetic decoder and produces the set of strings given by:

SS = 1111000001*111001*01*1001*110000000

Finally, assume that the FLAC decoder is programmed to estimate unpredictable points UP, corresponding to * in the string SS, by interpolation: if the symbol to the right to the * is 1, then the * is replaced by 1; otherwise it is replaced by 0. This produces a final estimate STR' for the source string, STR, given by:

STR' = 11110000011111001001110011110000000 whilst
STR = 11110000011111001001010011110000000

Thus, the estimated code string STR' and the original code string STR are equal in length and differ only in the 21st symbol.

In the above example it was stated that decoding is based on conventional arithmetic decoding techniques. This is true, and for predictable points PP constituting, in the above example, 31 out of the 35 code points, decoding is implemented using standard arithmetic decoding techniques. However, these techniques need to be modified slightly in order to interpret unpredictable points UP denoted by * in the above estimated code string STR'.

Figure 4:
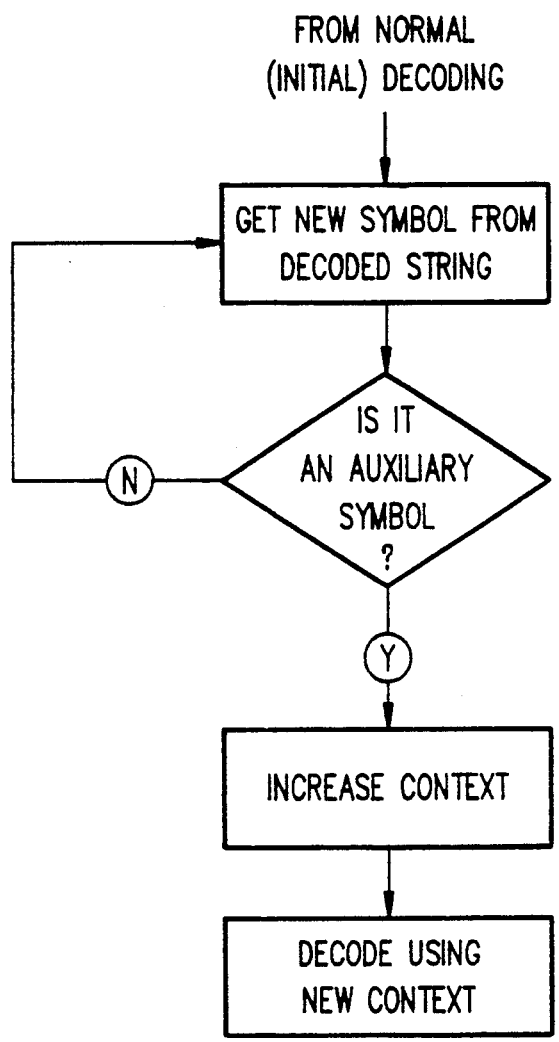
FIG. 4 is a flow diagram showing the principal steps of a method of decoding suitable for use with the method of encoding shown in FIG. 1.
Figure 5:
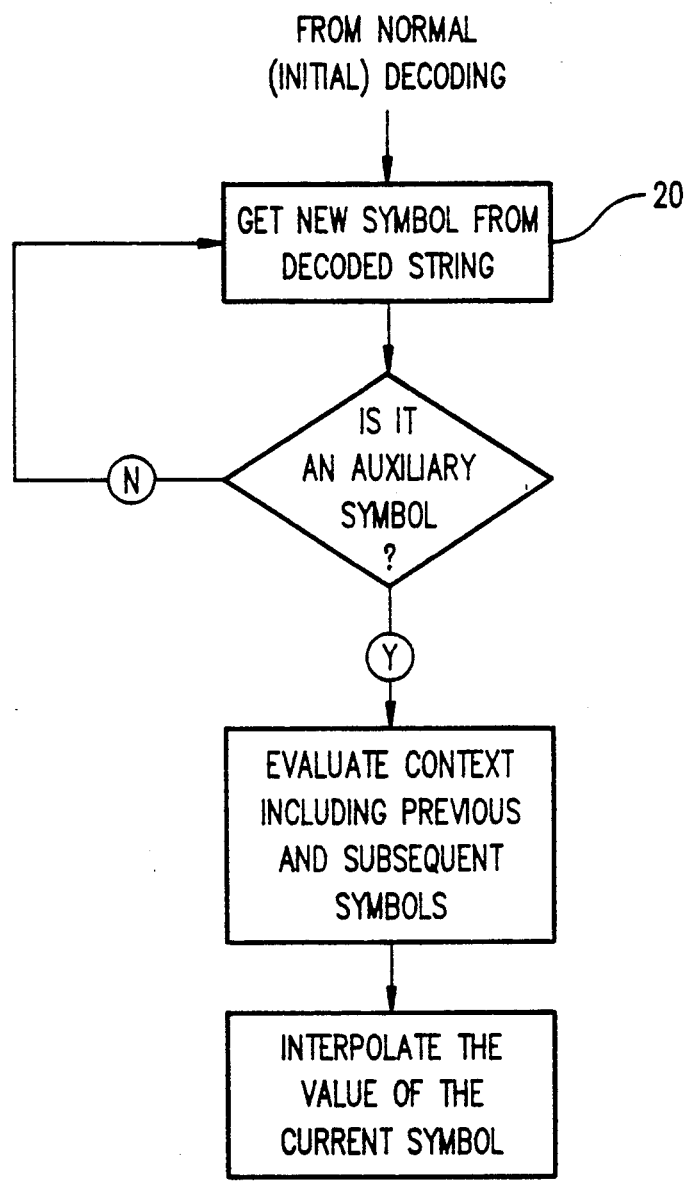
FIG. 5 is a flow diagram showing the additional steps of a two-pass method of decoding suitable for use with the method of encoding shown in FIG. 3.

Referring to FIGS. 3 to 5, there are shown flow diagrams which illustrate slight modifications which must be effected to standard arithmetic decoders in order to deal with unpredictable points.

FIG. 4 shows the relevant additional steps for decoding unpredictable points which were previously encoded according to the method described above with reference to FIG. 1 of the drawings. When the decoded string contains an auxiliary symbol, this indicates that the current point is unpredictable within the default context. If no further action is taken and the auxiliary symbol is not replaced by one of the symbols from the original symbol alphabet, then the decoded output string represents a set of possible strings, as explained in Example 2 above. If instead, however, the context of the auxiliary symbol is increased according to the same rules as used by the encoder shown in FIG. 1, then the unpredictable point becomes predictable and decoding is possible.

In Example 2 above, the auxiliary symbols, *, in the estimated output string STR' were not decoded by increasing their context but, rather, were interpolated. FIG. 5 shows a portion of a two-pass decoding operation for interpolating the value of an auxiliary symbol from a knowledge of the context of that symbol which includes both previously and successively decoded symbols. In other words, the symbols decoded in real time both before and after the auxiliary symbol are used in order to evaluate the value of the current symbol by interpolation between those symbols. Such a method of decoding is termed "two-pass" because two passes along the decoded symbol string are required in order to evaluate the axillary symbol. During the first pass, the predictable points are decoded and the locations, but not the values, of the unpredictable points are determined. The resulting string is then scanned during a second pass in order to interpolate the values of the unpredictable points from their context including predictable points both before and after each respective unpredictable point.

Figure 6:
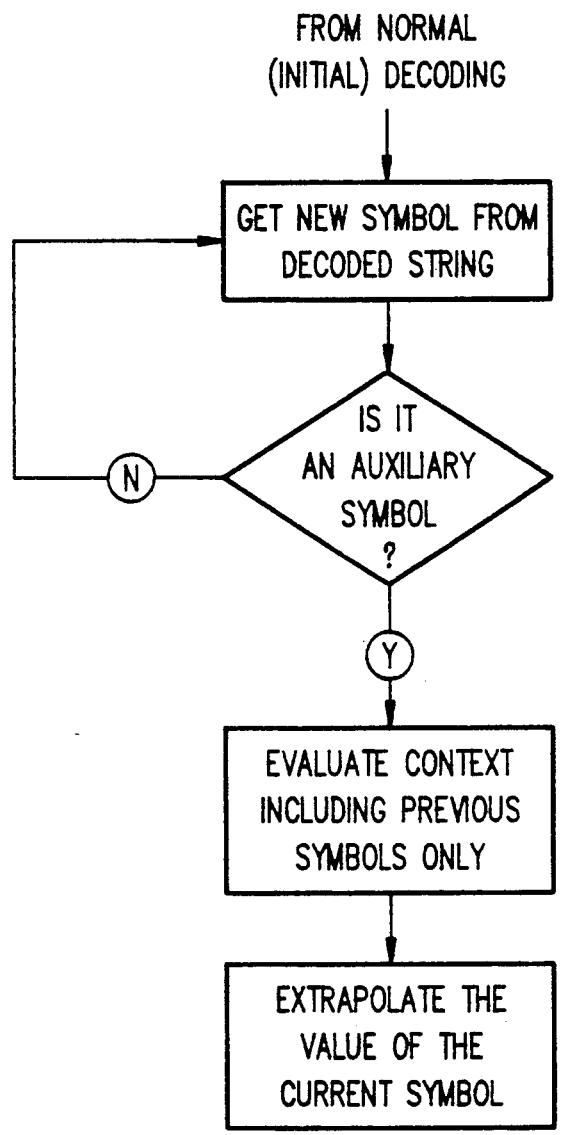
FIG. 6 is a flow diagram showing a method of one-pass decoding for use with the method of encoding shown in FIG. 3.

FIG. 6 shows an alternative method of evaluating unpredictable points using one-pass decoding. Here, a single pass along the decoded string is used, each auxiliary symbol being evaluated by extrapolating from its prior context. Since, in this case, symbols appearing after the unpredictable point are not considered, decoding of the auxiliary symbols may be performed in flight, as the string is decoded.

Figure 7:
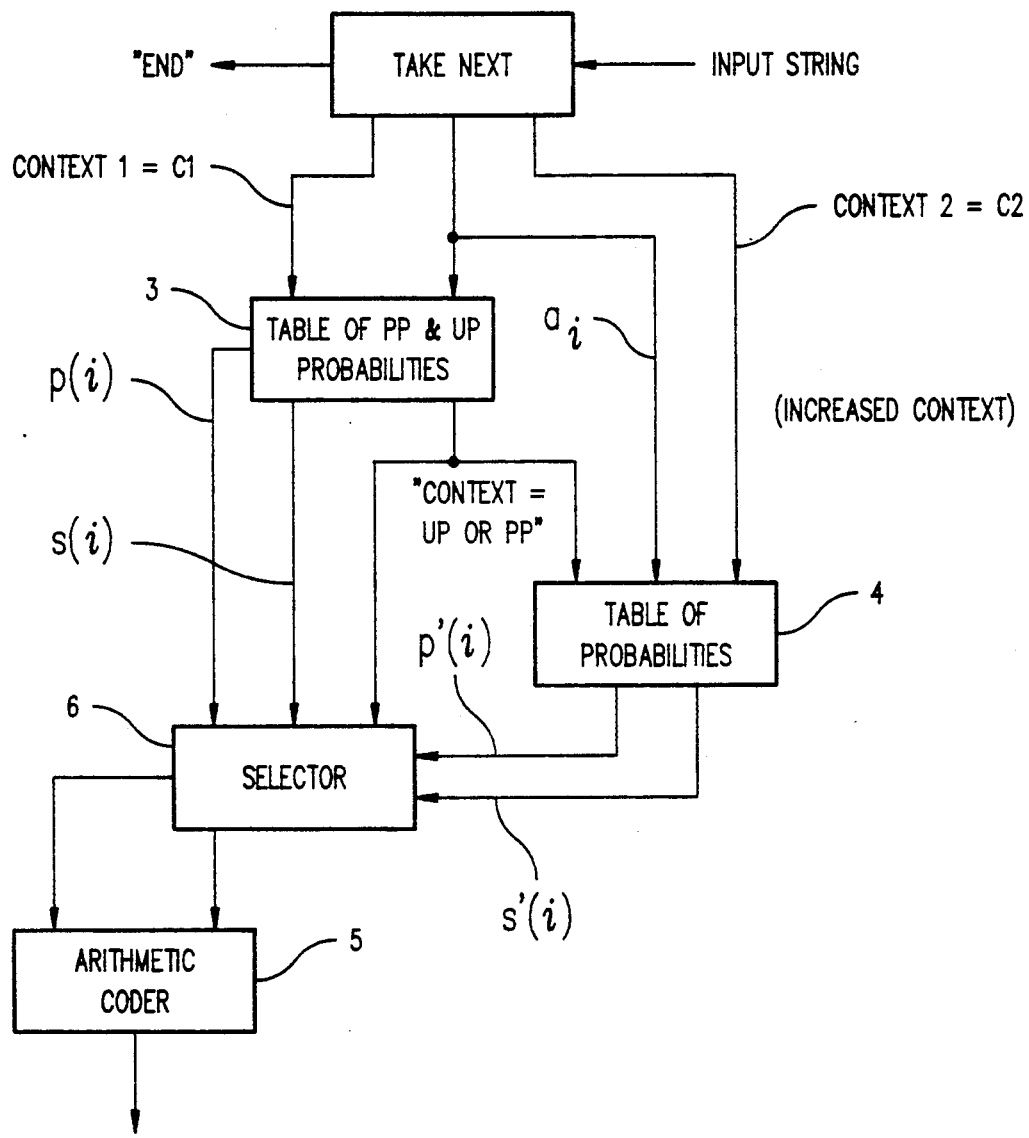
FIG. 7 relates to FIG. 1 and illustrates the flow of data between registers when performing the coding procedure according to FIG. 1.

FIG. 7 shows the flow of data between units in an arithmetic coder, employing the method shown in FIG. 1. For each new symbol ai in the input string, its context C1 is determined according to a predetermined rule. A LOOK-UP TABLE (3) contains the probabilities of all symbols and fuzzy sets corresponding to predictable and unpredictable points, respectively, according to the context C1. For predictable points PP, the output from the LOOK-UP TABLE (3) is the probability p(i) of the current symbol ai or of the fuzzy set containing this symbol and is cumulative probability S(i). The values p(i) and S(i) are fed to a SELECTOR (6) whose outputs p and S are fed to an ARITHMETIC CODER (5) which encodes the current symbol or the current fuzzy set according to the probability and cumulative probability, p and S, respectively, derived from the SELECTOR (6).

A second LOOK-UP TABLE (4) contains probabilities p'(i) and cumulative probabilities S'(i) according to an increased context C2. The values p'(i) and S'(i) are fed to the SELECTOR (6) and are selected in the event that the first context C1 indicates an unpredictable point UP. The outputs from the SELECTOR (6), p and S, are fed to the ARITHMETIC CODER (5), enabling the symbol to be encoded in the normal manner.

Figure 9:
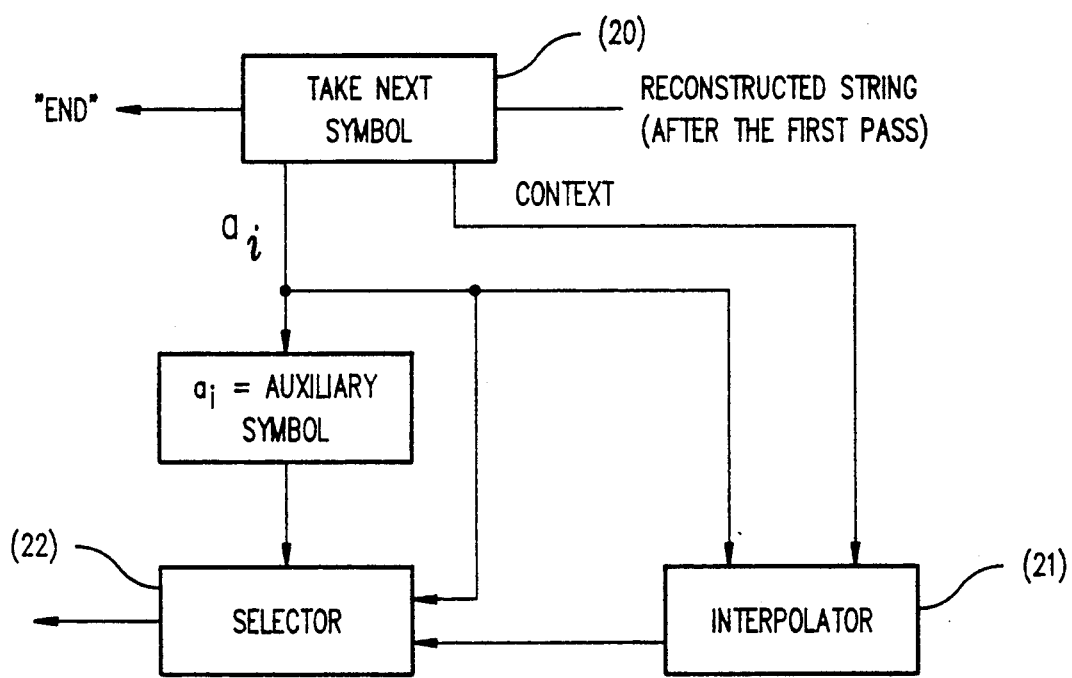
FIG. 9 relates to FIG. 8 and illustrates the flow of data between registers when performing the coding procedure according to FIG. 8 in a two-pass decoder.

Reference is now made to FIG. 8 which shows the relationship between the various shift registers in a fuzzy arithmetic coder employing the method described with reference to FIG. 3 of the drawings. For each symbol ai in the input string, the context is determined (11) and this context is compared against a standard table of contexts which permits classification of predictable points PP and unpredictable points UP. A LOOK-UP TABLE (12) containing the probabilities p(i) and cumulative probabilities S(i) for predictable points permits determination of the respective probabilities which are then fed to an ARITHMETIC CODER (15) for processing in the normal manner. For unpredictable points UP, the current symbol ai is set to an auxiliary symbol (13), denoted in Example 2 above by *, and a second LOOK-UP TABLE (14) is accessed, containing the probabilities for fuzzy sets containing the current symbol ai. The output from the second LOOK-UP TABLE (14), denoted by p'(i) and S'(i) and corresponding to the probability and the cumulative probability, respectively, of the current fuzzy set, are then fed to the ARITHMETIC CODER (15) for processing in the normal manner. Referring now to FIG. 9, part of a two-pass decoder is shown employing the method of two-pass decoding explained above with reference to FIG. 5 of the drawings. The reconstructed string after the first pass is fed to a REGISTER (20) permitting the reconstructed string to be scanned point by point. When the current symbol ai is any one of a predetermined set of auxiliary symbols, the context and the current auxiliary symbol ai are fed to an INTERPOLATOR (21) which replaces the auxiliary symbol by a corresponding symbol from the symbol alphabet according to predefined rules. The output from the INTERPOLATOR (21), as well as the current symbol ai are fed to a SELECTOR (22) whose output is either the current symbol ai or, alternatively, the output from the INTERPOLATOR (21) according to whether or not the current symbol ai is an auxiliary symbol.

It will be understood that in the general case there may be more than one fuzzy set, in which case the current auxiliary symbol will be reconstructed both according to the current context and also according to the particular fuzzy set to which the current symbol ai belongs. If, for example, the code string comprises consonants, vowels, numerals and punctuation (i.e. four distinct classes of data) and a particular unpredictable point is known to be a vowel, then during the first pass of a two-pass decoder the current symbol will be replaced by a particular auxiliary symbol corresponding to the class of vowels. During the second pass, the symbol will be interpolated from the current context, thereby permitting a specific vowel to be substituted for the auxiliary symbol.

Thus, in accordance with the invention, there is provided an improved method of arithmetic coding which may be adapted, as required, to lossy or lossless coding. It has been found that the method of lossy coding according to the invention may result in a 16% increasing in compression over conventional arithmetic coders. It will be appreciated that since the number of unpredictable points UP is relatively small, more computing resources may be allocated to these problematic points. For instance, it is quite possible that, for a given application, available CPU power will allow only four bits to be allocated for context determination. Under these circumstances, only sixteen different contexts may be considered for each point in the source data string. However, it is quite conceivable that for 1% of unpredictable points UP, ten bits can be allocated thereby resulting in 1024 contexts, thereby permitting the entropy of the unpredictable points to be reduced and the overall compression ratio to be increased.

We claim:

1. An apparatus for arithmetically encoding a pattern of symbols including arithmetically encoding ambiguous symbols so as to effectuate a compressed code string thereof, said symbols in said pattern being taken from a finite symbol set, each symbol appearing in a position of said pattern, said compressed code string being a digital signal representation of a number based on the probabilities of said symbols appearing in a predetermined order in said pattern, comprising:

first register means for receiving at least a portion of the pattern of symbols;

second register means for storing and shifting out elements of the compressed code string of said pattern of symbols;

means (FIG. 7 - 3,4,6) for determining predictable positions PP and unpredictable positions UP in the pattern in said first register means including means for evaluating a given first sub-pattern of the symbols in said first register positions in the vicinity of each first register position representing a context, a UP being defined when the register position sub pattern contains any one of a set of selected symbol sub patterns, and a PP being defined in all other cases; and means (FIG. 7 - 5) responsive to the prediction means for arithmetically encoding each symbol in the first register occupying a PP using the symbol's probability in the respective position or context and including means for arithmetically encoding each symbol in the register occupying a UP using the combined probability of a predetermined set of possible symbols which could appear in the respective positions, and placing the arithmetically encoded symbols in the second register means.

2. The apparatus according to claim 1, wherein said apparatus further comprises:

a first memory for storing a first sub pattern of positions representing the context for each symbol;

a second memory for storing a predetermined set of possible sub patterns;

means for comparing, for each symbol, the first sub pattern in the first memory with each one of the set of sub-patterns in the second memory and generating either a first signal, in the event that said sub pattern matches one of the set of sub patterns, or, a second signal otherwise;

a third memory for storing a first look-up table containing the probabilities of each symbol in the symbol set in the context of each one of the complete set of possible sub patterns;

a fourth memory for storing a second look-up table containing the combined probabilities of a predetermined set of possible symbols in the context of each one of said predetermined set of sub patterns;

means for ascertaining the stored probability corresponding to said sub-pattern responsive to either the first or second signal by table look up of the contents of the third or fourth memories, and means for arithmetically encoding each symbol according to the ascertaining means and responsive to the determined probability for encoding each symbol.

3. A method for recursively mapping successive symbols drawn from a Markov source of predetermined order and finite alphabet from a first register into digital signals representative of a compression of the successive symbols and of a magnitude of an ever lengthening fraction in the bounded ]0,1 interval in a second register, the mapping being a function of the instantaneous value of the fraction and predetermined occurrence statistics of the symbols in the alphabet and of the Markov source including the statistics of the current being encoded, comprising the steps of:

(a) with respect to the current symbol resident in said first register, ascertaining whether its occurrence statistic lies within a predetermining range by referencing a memory stored table, and, providing auxiliary signal indication of a first kind (UP) if said statistic does so lie and auxiliary signal indication of a second kind (PP) otherwise;

(b) for each signal indication of the first kind, interpolating a value to be appended to the ever lengthening fraction resident in the second register as an arithmetically encoded function of the instantaneous value of the fraction and the occurrence statistics of a predetermined number of adjacent successive symbols selectively positioned before or after the current symbol being encoded; and (c) for each signal indication of the second kind, appending digital signals indicative of a value to the ever lengthening fraction resident in the second register as an arithmetically encoded function of the instantaneous value of the fraction and the occurrence statistic of the current symbol being encoded.

* * * * *

UNITED STATES PATENT AND TRADEMARK OFFICE
CERTIFICATE OF CORRECTION

PATENT NO. : 5,142,283
DATED : August 25, 1992
INVENTOR(S) : Dan S.Chevion, et al.

It is certified that error appears in the above-identified patent and that said Letters Patent is hereby corrected as shown below:

Column 16, line 45, insert -- symbol -- after current

Column 16, line 65, insert -- . -- after fraction

Signed and Sealed this

Twenty-third Day of November, 1993

Attest:

BRUCE LEHMAN

Attesting Officer    Commissioner of Patents and Trademarks